United States Patent
Sakamoto et al.

(10) Patent No.: US 9,344,057 B2
(45) Date of Patent: May 17, 2016

(54) TUNING-FORK TYPE CRYSTAL RESONATOR PLATE

(71) Applicant: DAISHINKU CORPORATION, Kakogawa-shi, Hyogo (JP)

(72) Inventors: Yoshinobu Sakamoto, Kakogawa (JP); Satoru Ishino, Kakogawa (JP); Yoshinari Morimoto, Kakogawa (JP); Taiki Goto, Kakogawa (JP)

(73) Assignee: DAISHINKU CORPORATION, Kakogawa-shi (JP)

( * ) Notice: Subject to any disclaimer, the term of this patent is extended or adjusted under 35 U.S.C. 154(b) by 0 days.

(21) Appl. No.: 14/409,272

(22) PCT Filed: Dec. 11, 2013

(86) PCT No.: PCT/JP2013/083243
§ 371 (c)(1),
(2) Date: Dec. 18, 2014

(87) PCT Pub. No.: WO2014/097945
PCT Pub. Date: Jun. 26, 2014

(65) Prior Publication Data
US 2015/0171824 A1 Jun. 18, 2015

(30) Foreign Application Priority Data
Dec. 21, 2012 (JP) ................. 2012-280035

(51) Int. Cl.
*H03H 9/21* (2006.01)
*H03H 9/02* (2006.01)
*H03H 9/10* (2006.01)

(52) U.S. Cl.
CPC ............. *H03H 9/21* (2013.01); *H03H 9/02062* (2013.01); *H03H 9/02157* (2013.01); *H03H 9/1021* (2013.01)

(58) Field of Classification Search
CPC .................................. H03H 9/21; H03H 9/215
USPC .......................................................... 310/370
See application file for complete search history.

(56) References Cited

U.S. PATENT DOCUMENTS

| | | | |
|---|---|---|---|
| 4,384,232 A | 5/1983 | Debely | |
| 7,168,319 B2 * | 1/2007 | Dalla Piazza et al. | 73/504.16 |
| 7,253,554 B2 * | 8/2007 | Dalla Piazza et al. | 310/370 |
| 7,863,804 B2 * | 1/2011 | Tanaya | 310/370 |
| 8,400,049 B2 * | 3/2013 | Yang et al. | 310/370 |

(Continued)

FOREIGN PATENT DOCUMENTS

| JP | 2004-007428 A | 1/2004 |
|---|---|---|
| JP | 2004-282230 A | 10/2004 |

(Continued)

*Primary Examiner* — J. San Martin
(74) *Attorney, Agent, or Firm* — Mots Law, PLLC

(57) ABSTRACT

For a tuning-fork type crystal resonator plate, a crystal plate having a crystal orientation is used. The tuning-fork type crystal resonator plate includes: a base portion; and a pair of first and second leg portions protruding from the base portion in one direction. In the first leg portion and the second leg portion, grooves are formed so that each of the grooves is biased relative to a center of the corresponding first or second leg portion in a width direction. A lowermost point of the groove is positioned in a middle of the groove in the width direction (width direction of the first leg portion and the second leg portion) in a state viewed from an end surface of the first and second leg portions in the width direction.

4 Claims, 12 Drawing Sheets

(56) References Cited

U.S. PATENT DOCUMENTS

| | | | |
|---|---|---|---|
| 2002/0121175 A1* | 9/2002 | Kitamura et al. | 84/402 |
| 2004/0085163 A1* | 5/2004 | Kikushima | 333/200 |
| 2005/0116586 A1* | 6/2005 | Tanaya et al. | 310/348 |
| 2007/0159029 A1 | 7/2007 | Aratake | |
| 2007/0228891 A1 | 10/2007 | Tanaya | |
| 2009/0289531 A1* | 11/2009 | Fang et al. | 310/370 |
| 2014/0078870 A1* | 3/2014 | Kobayashi | 368/47 |
| 2014/0111065 A1* | 4/2014 | Kobayashi | 310/370 |

FOREIGN PATENT DOCUMENTS

| | | |
|---|---|---|
| JP | 2006-086726 A | 3/2006 |
| JP | 2007-158386 A | 6/2007 |
| JP | 2007-258918 A | 10/2007 |

* cited by examiner

×1000

×1000

×1000

×1000

×1000

×1000

×1000

×1000

×300

×300

×300

×300

TUNING-FORK TYPE CRYSTAL RESONATOR PLATE

TECHNICAL FIELD

The present invention relates to a tuning-fork type crystal resonator plate.

BACKGROUND ART

As one of crystal resonator plates, a tuning-fork type crystal resonator plate is known, which is made up of a base portion and two leg portions protruding from the base portion (see, for example, Patent Document 1). Such a tuning-fork type crystal resonator plate includes: a pair of excitation electrodes having different potentials formed on the two leg portions; and concave grooves formed in both main surfaces of the two leg portions. A turning-fork type crystal resonator device is made by hermetically sealing the tuning-fork type crystal resonator plate within an inner space of a main body casing made up of a base and a lid (see, for example, Patent Document 1).

PRIOR ART DOCUMENT

Patent Document

[Patent Document 1] JP 2004-282230 A

SUMMARY OF INVENTION

Problem to be Solved by Invention

As shown in Patent Document 1, a crystal is used as a piezoelectric material for the tuning-fork type crystal resonator plate. Therefore, a substrate of the tuning-fork type crystal resonator plate has a crystal orientation. For this reason, in inner surfaces of the grooves formed in both main surfaces of the leg portions, not all side surfaces can be formed so as to be perpendicular to the respective main surfaces (a first main surface and a second main surface). That is, at least part of the side surfaces are inclined surfaces having an inclination to the respective main surfaces. Furthermore, since the substrate has the crystal orientation, inclined surfaces of a plurality of side surfaces facing each other in the groove have different angles of inclination. Thus, the inner surface of the groove does not have a symmetrical shape. Also, regarding a pair of grooves formed in both main surfaces of the respective leg portions, such a pair does not have symmetrical shapes.

Thus, in the tuning-fork type crystal resonator plate as shown in Patent Document 1, the weight balance of each leg portion is deteriorated due to the groove shape without symmetry. In the result, characteristics such as a CI value are degraded. As described above, this problem is caused by the material having the crystal orientation.

In order to resolve the above problem, an object of the present invention is to provide a tuning-fork type crystal resonator that can prevent the characteristics from being affected due to the groove shapes formed in the leg portions.

Means for Solving Problem

In order to achieve the above object, a tuning-fork type crystal resonator plate according to the present invention, for which a crystal plate having a crystal orientation is used, includes: a base portion; and a pair of leg portions protruding from the base portion in one direction. In the leg portions, grooves are formed so that each of the grooves is biased relative to a center of the corresponding leg portion in a width direction. A lowermost point of each of the grooves is positioned in a middle of the corresponding groove in the width direction in a state viewed from an end surface in the width direction.

Here, the state "be biased" is satisfied when each groove is formed in the corresponding leg portion so as to be biased relative to the center of the leg portion in the width direction. That is, it is sufficient that the distances from the groove (an inner surface of the groove) to both side surfaces of the leg portion are not the same, i.e., the sizes of the dike portions formed on the main surface of the leg portion are not the same.

The "middle" here is not limited strictly to the middle position of the groove (specifically, the middle position of the groove in the width direction). That is, even if the lowermost point is slightly deviated from the middle of the groove due to the manufacturing error, a similar operation and effect (described later) can be obtained. Thus, the deviation of the middle position due to manufacturing variability is within the present invention.

In the crystal resonator plate for which a crystal plate is used according to the present invention, in the inner surface of each of the grooves formed on both main surfaces of the leg portions, not all side surfaces can be formed so as to be perpendicular to the corresponding main surface. However, such a configuration also can be effective to maintain a weight balance of each of the leg portions by forming the groove so as to be biased relative to the center of the leg portion in the width direction.

However, only forming the groove so as to be biased relative to the center of the leg portion in the width direction cannot be the optimal means to maintain the weight balance of each of the leg portions. That is, even if the groove is formed so as to be maximally biased relative to the center of the leg portion in the width direction, the weight of the leg portion cannot be uniformed to the extent that the weight balance is maintained. This relates specifically to the current tendency of the tuning-fork type crystal resonator plate to be miniaturized. The conventional large-size tuning-fork type crystal resonator plate can maintain the balance without consideration of the weight balance. However, in the miniaturized tuning-fork type crystal resonator plate, the leg portions are also miniaturized and narrowed, and the weight balance is lost when the grooves are formed in the miniaturized/narrowed leg portions. Thus, the problem that was unthinkable with respect to the conventional tuning-fork type crystal resonator plate is accompanied by the miniaturization.

In contrast, the present invention has characteristics that the groove is formed so as to be biased relative to the center of the leg portion in the width direction, and that the lowermost point of the groove is positioned in the middle of the groove in the width direction in the state viewed from the end surface in the width direction. In such a configuration, since the lowermost point of the groove is positioned in the middle of the groove in the width direction, further weight correction can be performed to the configuration using a crystal plate in which the grooves are formed so as to be biased relative to the respective centers of the leg portions in the width direction, so that the weight balance can be maintained. This relates to the fact that a crystal plate is used for the crystal resonator plate. The side surfaces composed of the plurality of the surfaces of the groove include inclined surfaces. The inclined surfaces of the side surfaces (the plurality of surfaces) have different angles of inclination. Therefore, by forming the grooves, the leg portions lose the weight balance. However, in the present invention, the lowermost point of the groove is positioned in the middle of the groove in the width direction in the state viewed from the end surface in the width direction. Thus, it is possible to correct the angles of inclination of the inclined surfaces of the side surfaces of the groove, and the weight correction of the leg portions can be performed due to the correction of the angles. Consequently, the weight balance can be maintained and the shapes of grooves formed in the leg portions can prevent the characteristics (e.g., the CI value) from being affected.

Specifically, in the present invention using the crystal plate, the groove is formed in each of the leg portions so as to be biased relative to the center of each of the leg portions in the width direction, and the lowermost point of the groove is positioned in the middle of the groove in the width direction in the state viewed from the end surface in the width direction. Thus, it is possible to prevent the weight balance of each of the leg portions from being lost.

The position of the groove is biased relative to the center of the leg portion in the width direction, so that the left and right weight balance of the leg portions in the width direction can be maintained. Furthermore, since the lowermost point of the groove is positioned in the middle of the groove in the width direction in the state viewed from the end surface in the width direction, it is possible to reduce the differences in the angles of inclination of the inclined surfaces of the side surfaces (the plurality of surfaces). In the result, a good weight balance is maintained. On the other hand, in the conventional tuning-fork type crystal resonator plate, the angles of the inclination of the left and right inclined surfaces in the leg portion considerably differ from each other. Accordingly, the vibrations of the left and right leg portions in the longitudinal direction differ from each other, which deteriorating the weight balance.

Also, in a case in which the groove has a bottom surface differently from the present invention, the position of the lowermost point cannot be determined, which deteriorates the weight balance. In the present invention, this problem does not occur. In the present invention, the groove has no bottom surface, but has only the lowermost point.

Furthermore, in the conventional tuning-fork type crystal resonator plate that has the grooves in the respective leg portions, not only the main vibration for the excitation but also other vibration modes (longitudinal vibration mode and the like) are generated. This relates to the fact that, in the conventional configuration, the lowermost point or the bottom surface of the groove is formed so as to be significantly biased relative to the center of the leg portion in the width direction. Also, the inner surface (side surfaces) of the groove is a surface inclined relative to the main surface.

In contrast, in the present invention, the groove is formed in each of the leg portions so as to be biased relative to the center in the width direction, and the lowermost point of the groove is positioned in the middle of the groove in the width direction in the state viewed from the end surface in the width direction. Thus, in the state viewed from the end surface in the width direction, the shapes of the side surfaces out of the inner surface of the groove can be symmetrical or substantially symmetrical. Also, compared with the conventional tuning-fork type crystal resonator plate, one or more inclined surfaces out of the inner surface of the groove can be decreased. In the result, it is possible to suppress the generation of the other vibration modes (longitudinal vibration mode and the like) that would be caused by the decreased inclined surfaces. Thus, it is possible to prevent the characteristics of the tuning-fork type crystal resonator plate from degrading, specifically, it is possible to decrease the CI value, or to suppress the increase of the CI value.

These days, there is a tendency of miniaturization of the size of the package for a piezoelectric resonator device, such as a crystal resonator and an oscillator, on which a tuning-fork type crystal resonator plate is mounted (e.g., the package size: not more than 2.0 mm×1.2 mm). The inventor has confirmed that, according to the miniaturization, spurious is generated in the vibration of the tuning-fork type crystal resonator plate. On the other hand, conventionally, the spurious has hardly been generated in the tuning-fork type crystal resonator plate, and there has been no need to consider spurious suppression. However, in the actual miniaturized tuning-fork type crystal resonator plate, it is necessary to consider the spurious suppression. With regard to the spurious occurrence, it is possible to suppress the spurious in the present invention, by reducing the inclined surfaces of the side surfaces of the groove, and reducing the differences in the angles of inclination among the inclined surfaces. Thus, the present invention is optimal for the miniaturized tuning-fork type crystal resonator plate. Furthermore, it is possible to prevent the value of oscillation frequency (the value of the main vibration) from being changed due to the spurious occurrence.

In the above-described configuration, it is preferable that, in both main surfaces of the leg portions, the groove on a side of a first main surface and the groove on a side of a second main surface are respectively formed, and that the lowermost point of the groove on the side of the first main surface and the lowermost point of the groove on the side of the second main surface are opposed to each other in a state viewed from an end surface in the protruding direction.

In this case, the respective lowermost points of the groove on the side of the first main surface and the groove on the side of the second main surface are opposed to each other in the state viewed from the end surface in the protruding direction. Thus, it is possible to prevent the weight balance from being deteriorated in the thickness direction of each of the leg portions. In the result, it is possible to suppress the generation of other vibration modes (longitudinal vibration mode and the like) due to deterioration of the weight balance. Thus, it is possible to prevent the characteristics of the tuning-fork type crystal resonator plate from degrading, specifically, it is possible to decrease the CI value, or to suppress the increase of the CI value.

Effects of Invention

With the present invention, it is possible to prevent the characteristics from being affected due to the groove shapes formed in the leg portions.

MODES FOR CARRYING OUT INVENTION

Hereinafter, embodiments of the present invention will be described with reference to the drawings. In the embodiments described below, a case will be shown in which the present invention is applied to a tuning-fork type crystal resonator as a turning-fork type crystal resonator device. However, these are merely preferred embodiments and the present invention is not limited to the tuning-fork type crystal resonator. The present invention may be applied to any turning-fork type crystal resonator device that is provided with a tuning-fork type crystal resonator plate, for example, a crystal oscillator.

Embodiment 1

Figure 1:
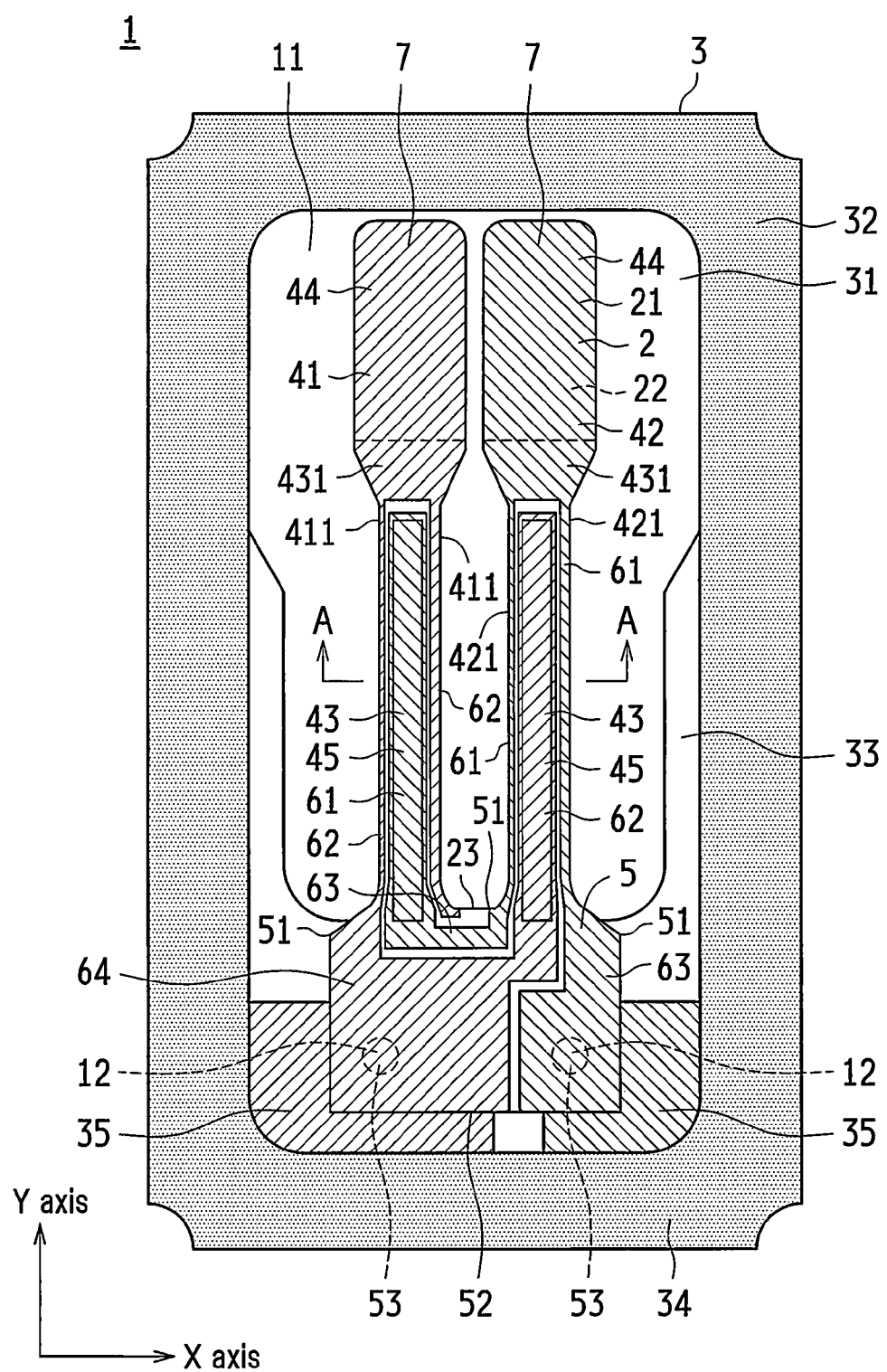
FIG. 1 is a diagram showing an inside of a tuning-fork type crystal resonator according to a first embodiment of the present invention, more specifically, a schematic plan view of a base on which a tuning-fork type crystal resonator plate is mounted.

As shown in FIG. 1, a tuning-fork type crystal resonator 1 according to the present embodiment (hereinafter referred to as "crystal resonator") includes: a tuning-fork type crystal resonator plate 2 (hereinafter referred to as "crystal resonator plate") that is shaped by a photolithography method; a base 3 on which the crystal resonator plate 2 is mounted; and a lid (not shown) to hermetically seal the crystal resonator plate 2 mounted (held) on the base 3 within a main body casing.

In this crystal resonator 1, the main body casing is formed by bonding the base 3 and the lid. Specifically, the base 3 and the lid are bonded via a sealant (not shown), whereby an inner space 11 is formed in the main body casing. The crystal resonator plate 2 is bonded and held on the base 3 within the inner space 11 of the main body casing via conductive bumps 12, and the inner space 11 of the main body casing is hermetically sealed. In this case, the crystal resonator plate 2 is electrically and mechanically bonded to the base 3 by ultrasonic FCB (flip chip bonding) using the conductive bumps 12 made of a metal material (e.g., gold) and the like.

Next, each component of the crystal resonator 1 will be described.

As shown in FIG. 1, the base 3 is formed as a box-like body made up of a bottom portion 31 and a dike portion 32 that extends upward from the bottom portion 31. The dike portion 32 is made of two laminated layers, and a step portion 33 is provided in the inner space 11. The base 3 is made by: placing a single rectangular parallelepiped made of a ceramic material on a rectangular-shaped plate in plan view made of a ceramic material; and baking them into a single unit having a concave shape. The dike portion 32 is shaped along a periphery of the bottom portion 31 in plan view, as shown in FIG. 1. On a top surface of the dike portion 32, a metallization layer 34 (part of sealant) is provided so as to be bonded to the lid. The metallization layer 34 is made by plating, for example, a tungsten layer or molybdenum layer with nickel and gold in this order.

In the base 3 obtained by baking the laminated ceramic materials into the single unit having the concave shape, a step portion 33 is formed at one end portion in the longitudinal direction of the inner space 11 and at part of end portions along the longitudinal direction of the inner space 11. At one end portion of the step portion 33 in the longitudinal direction, a pair of electrode pads 35 is formed as shown in FIG. 1. The crystal resonator plate 2 is mounted and held on the electrode pads 35. The electrode pads 35 are electrically connected to terminal electrodes (not shown) formed on the rear surface of the base 3 via respectively corresponding routing electrodes (not shown). The terminal electrodes are connected to external electrodes of an external component or an external device. The electrode pads 35, the routing electrodes and the terminal electrodes are formed by being integrally baked with the base 3 after printing a metallization material such as tungsten, molybdenum or the like. On some of the electrode pads 35, the routing electrodes and the terminal electrodes, nickel is plated on the metallization, and gold is plated on the nickel plating.

The lid is made of, for example, a metal material, and is shaped into a single rectangular plate in plan view. On the undersurface of the lid, part of a sealant is formed. The lid is bonded to the base 3 via the sealant by a method such as seam welding, beam welding, hot-melt bonding or the like. Thus, the main body casing of the crystal resonator 1 is made up of the lid and the base 3.

Next, the crystal resonator plate 2 will be described. The crystal resonator plate 2 is disposed in the inner space 11 of the main body casing, which is made up of the base 3 and the lid, of the crystal resonator 1.

The crystal resonator plate 2 is a crystal plate shaped from a crystal wafer (not shown) made of a crystal Z plate that is an anisotropic material having a crystal orientation. The board outline of the crystal resonator plate 2 is shaped in a lump (integrally) using a photolithography technique (photolithography method), for example, by wet etching using a resist or a metal film as a mask.

As shown in FIG. 1, the board of the crystal resonator plate 2 has an outline made up of: a pair of leg portions 41 and 42 (a first leg portion 41 and a second leg portion 42) serving as vibrating portions; and the base portion 5 includes a first end surface 51 from which the first leg portion 41 and the second leg portion 42 protrude.

As shown in FIG. 1, the base portion 5 has a bilaterally symmetrical shape in plan view, and is formed wider than the first leg portion 41 and the second leg portion 42. Also, the vicinity of the first end surface 51 of the base portion 5 is formed so as to be gradually wider from the side of the first end surface 51 toward the side of the second end surface 52.

Also, in the base portion 5, two joints 53 are provided. The joints 53 are bonded to the electrode pads 35 of the base 3 via the conductive bumps 12. The joints 53 are provided respectively in the vicinity of both ends of a second main surface 22 of the base portion 5.

As shown in FIG. 1, the pair of leg portions 41 and 42 protrudes from the first end surface 51 of the base portion 5 and is arranged in parallel with each other with a gap portion 23 interposed therebetween. Here, the gap portion 23 is disposed in the middle position (middle region) of the first end surface 51 in the width direction.

Next, the two leg portions 41 and 42 (the first leg portion 41 and the second leg portion 42) will be described with reference to the drawings.

Each of the two leg portions 41 and 42 is made up of: an excitation portion 43 protruding from the first end surface 51 of the base portion 5; and an adjustment portion 44 that continues from the distal end portion 431 of the excitation portion 43 and that extends toward the protruding direction (Y-axis direction shown in FIG. 1) of the excitation portion 43.

As shown in FIG. 1, in both main surfaces 21 and 22 (a first main surface 21 and the second main surface 22) of each of the excitation portions 43, a groove 45 on the side of the first main surface 21 and a groove 45 on the side of the second main surface 22 are respectively formed so as to be biased relative to the corresponding center of each of the leg portions 41 and 42 in the width direction in order to improve a CI value that deteriorates due to miniaturization of the crystal resonator plate 2.

The groove 45 on the side of the first main surface 21 and the groove 45 on the side of the second main surface 22 of the second leg portion 42 have the shapes respectively similar to the groove 45 on the side of the first main surface 21 and the groove 45 on the side of the second main surface 22 of the first leg portion 41. Therefore, taking the first leg portion 41 shown in FIG. 1 as an example, the groove 45 on the side of the first main surface 21 and the groove 45 on the side of the second main surface 22 of each of the two leg portions 41 and 42 will be described below.

As shown in FIGS. 1 to 5, the groove 45 on the side of the first main surface 21 and the groove 45 on the side of the second main surface 22 are formed in the first leg portion 41. These grooves 45 are each shaped in a concave shape by wet etching, and are made up of a plurality of surfaces (side surfaces 452) as shown in FIGS. 1 to 5.

Figure 2:
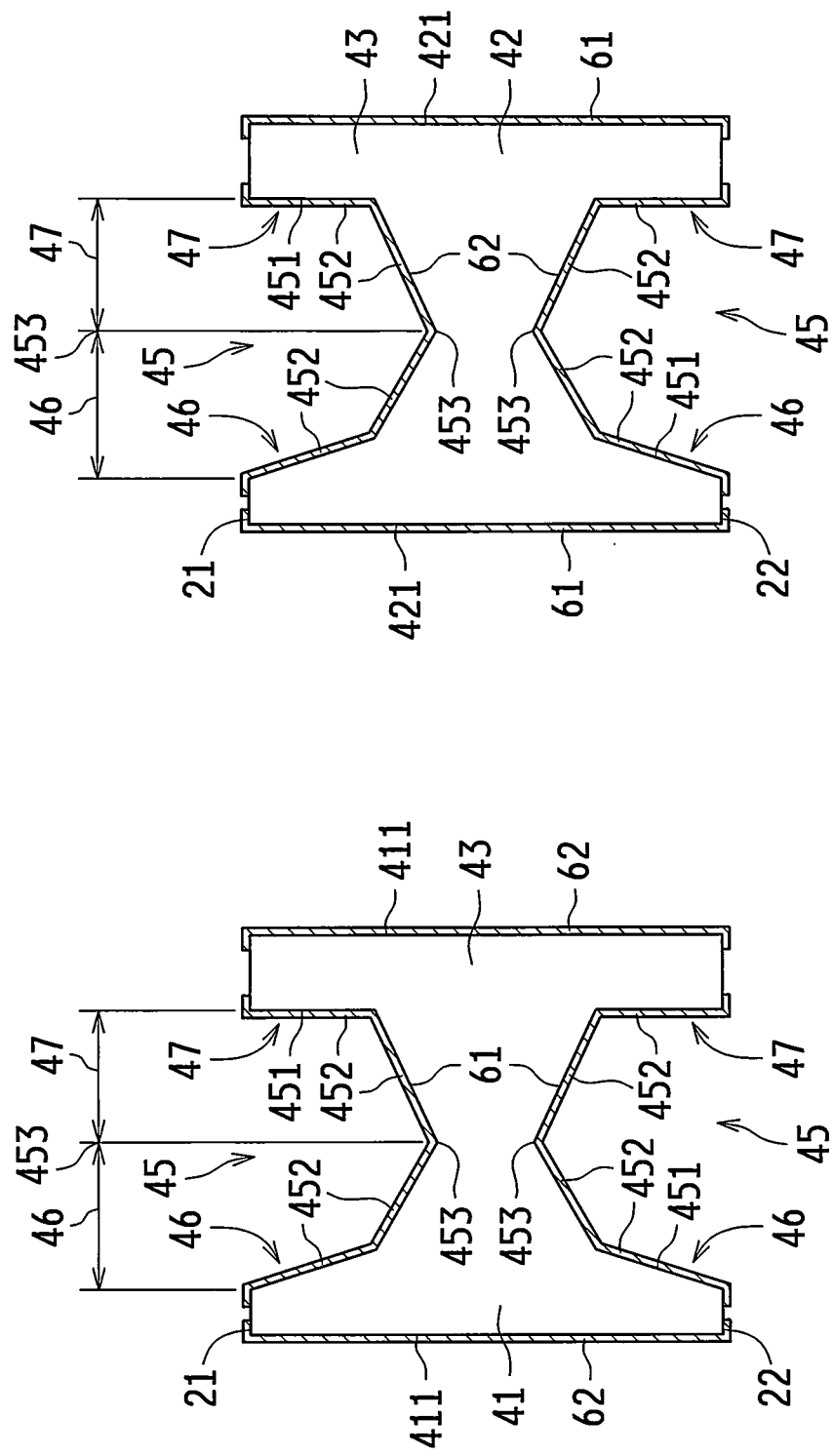
FIG. 2 is an end view taken from line A-A of the crystal resonator plate shown in FIG. 1.

In the groove 45 on the side of the first main surface 21 and the groove 45 on the side of the second main surface 22, a lowermost point 453 of the groove 45 on the side of the first main surface 21 is positioned in the middle of the groove 45 on the side of the first main surface 21, and a lowermost point 453 of the groove 45 on the side of the second main surface 22 is positioned in the middle of the groove 45 on the side of the second main surface 22, when viewed from the end surface of the first leg portion 41 in the width direction (X-axis direction) as shown in FIG. 2.

Figure 5:
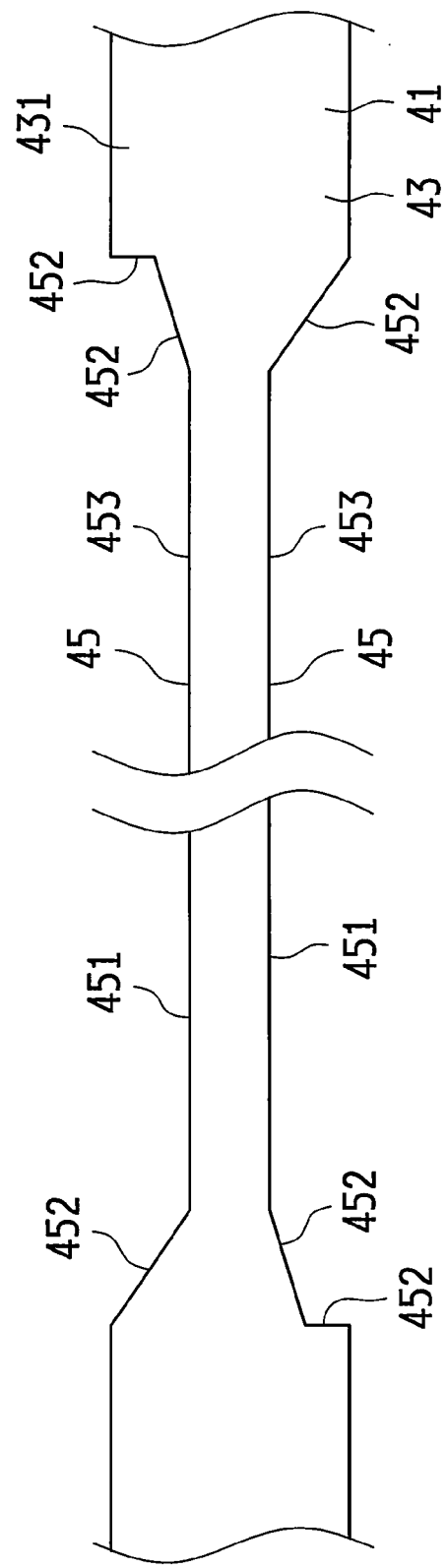
FIG. 5 is an end view taken from line B-B of FIGS. 3 and 4.

Also, as shown in FIG. 2, the lowermost point 453 of the groove 45 on the side of the first main surface 21 and the lowermost point 453 of the groove 45 on the side of the second main surface 22 are opposed to each other. The grooves 45 are symmetric with respect to a point in a state viewed from the end surface of the first leg portion 41 in the longitudinal direction (protruding direction) as shown in FIG. 5, i.e., in a state viewed from the end surface taken from line B-B of FIGS. 3 and 4. Furthermore, the length of the lowermost point 453 according to the present embodiment is longer than the length of lowermost point or the length of the bottom surface formed on the conventional tuning-fork type crystal resonator plate. That is to say, compared with the conventional tuning-fork type crystal resonator plate, the region for performing excitation can be increased.

As shown in FIG. 2, the shape viewed from the end surface of each of the first leg portion 41 and the second leg portion 42 in the width direction (X-axis direction shown in FIG. 1) has substantially H-shape. The grooves 45 are formed in each of the first leg portion 41 and the second leg portion 42 so as to be biased relative to the respective centers of the first leg portion 41 and the second leg portion 42 in the width direction (X-axis direction). Here, the state "be biased" is satisfied when the grooves 45 are formed in each of the first leg portion 41 and the second leg portion 42 so as to be biased relative to the respective centers of the first leg portion 41 and the second leg portion 42 in the width direction (X-axis direction). That is, it is sufficient that the distances from the groove 45 (side surfaces 452 of the groove 45) to both side surfaces 411 or to both side surfaces 421 of the leg portion (the first leg portion 41 or the second leg portion 42) are not completely the same, i.e., the sizes of the dike portions formed on each of the main surfaces (the first main surface 21 and the second main surface 22) of the first leg portion 41 or the second leg portion 42 are not completely the same.

Also, in the groove 45, an inner surface 451 is formed from a first inclined surface 46 and a second inclined surface 47 with the lowermost point 453 being interposed therebetween in the width direction (X-axis direction) of each of the first leg portion 41 and the second leg portion 42, as shown in FIG. 2. The ratio R of the width of the first inclined surface 46 in the width direction to the width of the second inclined surface 47 in the width direction is 1≤R≤1.3. That is, the width of the first inclined surface 46 in the width direction is the same (including substantially the same) as the width of the second inclined surface 47 in the width direction. Here, the value R=1.3 indicates, for example, the upper limit of the dimension error caused by a manufacturing error and the like. In the case of 1.3<R (e.g., R=1.35, 1.56, 1.86, 2.33 and the like), the problem cannot be solved. In the present embodiment, the ratio between the width of the second inclined surface 47 in the width direction and the width of the first inclined surface 46 in the width direction is 50:50 to 47:53 (in FIG. 2, 47:53), and the specific widths of the first inclined surface 46 and the second inclined surface 47 are respectively, for example, 22.3 μm and 19.7 μm. Thus, in the first leg portion 41 and the second leg portion 42 according to the present embodiment, the lowermost point 453 of the groove 45 is positioned in the middle of the groove 45 in the state viewed from the end surface in the X-axis direction shown in FIG. 2. As described above, the "middle" here is not limited strictly to the middle position of the groove 45 (specifically, the middle position of the groove 45 in the X-axis direction). Even if the lowermost point 453 is slightly deviated from the middle of the groove 45 (R≤1.3) due to the manufacturing error and the like, an operation and effect (described later) similar to the present embodiment can be obtained. Thus, the deviation of the middle position due to manufacturing variability is within the present embodiment.

The adjustment portion 44 continues and extends from the distal end portion 431 of the excitation portion 43 so as to have the same width as the width of the distal end surface of the distal end portion 431 of the excitation portion 43. The distal end corners of the adjustment portion 44 are each formed in a curved shape, thereby, the distal end corners can be prevented from making contact with the dike portion 32 and the like of the base 3 when receiving an external force and the like. In the present embodiment, the distal end corners of the adjustment portion 44 in the protruding direction are each formed in the curved shape, however, they are not limited thereto. They may be each formed in a tapered shape.

The crystal resonator plate 2 configured as described above includes a first excitation electrode 61 and a second excitation electrode 62 both having different potentials, and lead electrodes 63 and 64 drawn out from the first excitation electrode 61 and the second excitation electrode 62 so as to electrically connect the first excitation electrode 61 and the second excitation electrode 62 to the electrode pads 35 of the base 3.

The first excitation electrode 61 and the second excitation electrode 62 are partly formed inside the groove 45 (i.e. on the inner surface). For this reason, even when the crystal resonator plate 2 is miniaturized, vibration loss in the first leg portion 41 and the second leg portion 42 is suppressed, thus the CI value can be reduced to a low level.

The first excitation electrode 61 is formed on both main surfaces 21 and 22 of the excitation portion 43 of the first leg portion 41, and on both of the side surfaces 421 (both side surfaces 421) of the excitation portion 43 of the second leg portion 42. Likewise, the second excitation electrode 62 is formed on both main surfaces 21 and 22 of the excitation portion 43 of the second leg portion 42, and on both of the side surfaces 411 (both side surfaces 411) of the excitation portion 43 of the first leg portion 41.

The lead electrodes 63 and 64 are formed on the base portion 5 and on the adjustment portion 44 of each of the two leg portions 41 and 42 (the first leg portion 41 and the second leg portion 42). Specifically, by the lead electrode 63 formed on the base portion 5, the first excitation electrode 61 formed on both main surfaces 21 and 22 of the excitation portion 43 of the first leg portion 41 is connected to the first excitation electrode 61 formed on both of the side surfaces 421 (both side surfaces 421) of the excitation portion 43 of the second leg portion 42. Here, each first excitation electrode 61 formed on both of the side surfaces 421 (both side surfaces 421) of the excitation portion 43 of the second leg portion 42 is connected to each other by the lead electrode 64 formed on one end portion on the side of the excitation portion 43 of the adjustment portion 44 of the second leg portion 42. Likewise, by the lead electrode 64 formed on the base portion 5, the second excitation electrode 62 formed on both main surfaces 21 and 22 of the excitation portion 43 of the second leg portion 42 is connected to the second excitation electrode 62 formed on both of the side surfaces 411 (both side surfaces 411) of the excitation portion 43 of the first leg portion 41.

On the adjustment portion 44 of each of the two leg portions 41 and 42, a metal film 7 for frequency adjustment is formed on the side more distal than the one end portion on which the lead electrodes 63 and 64 are formed. The metal film 7 for frequency adjustment is used for adjustment of the frequency of the crystal resonator plate 2. In FIG. 1, the dashed line indicates a borderline of the adjustment portion 44 between the region on which the lead electrodes 63 and 64 are formed and the region on which the metal film 7 for frequency adjustment is formed.

The shape of the groove 45 of the crystal resonator plate 2 according to the present embodiment was compared with the groove of the conventional tuning-fork type crystal resonator plate (hereinafter also referred to as "conventional crystal resonator plate"). The results are shown in FIGS. 6 to 11.

Figure 3:
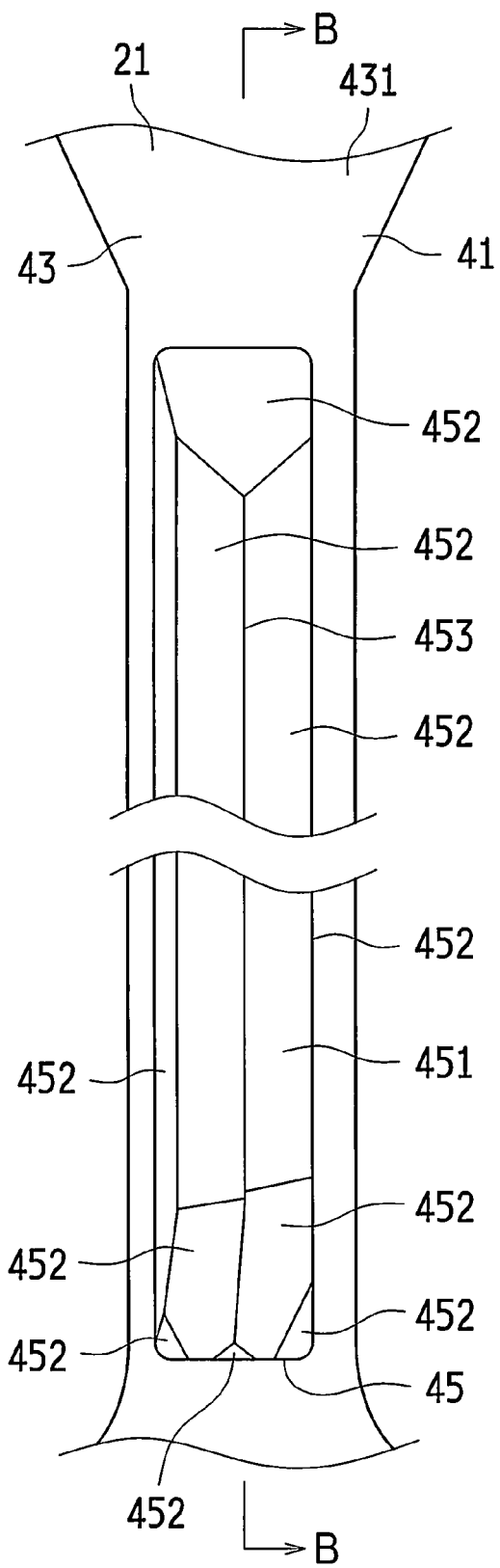
FIG. 3 is a schematic plan view of a groove formed in a first leg portion of the tuning-fork type crystal resonator plate according to the first embodiment of the present invention.
Figure 4:
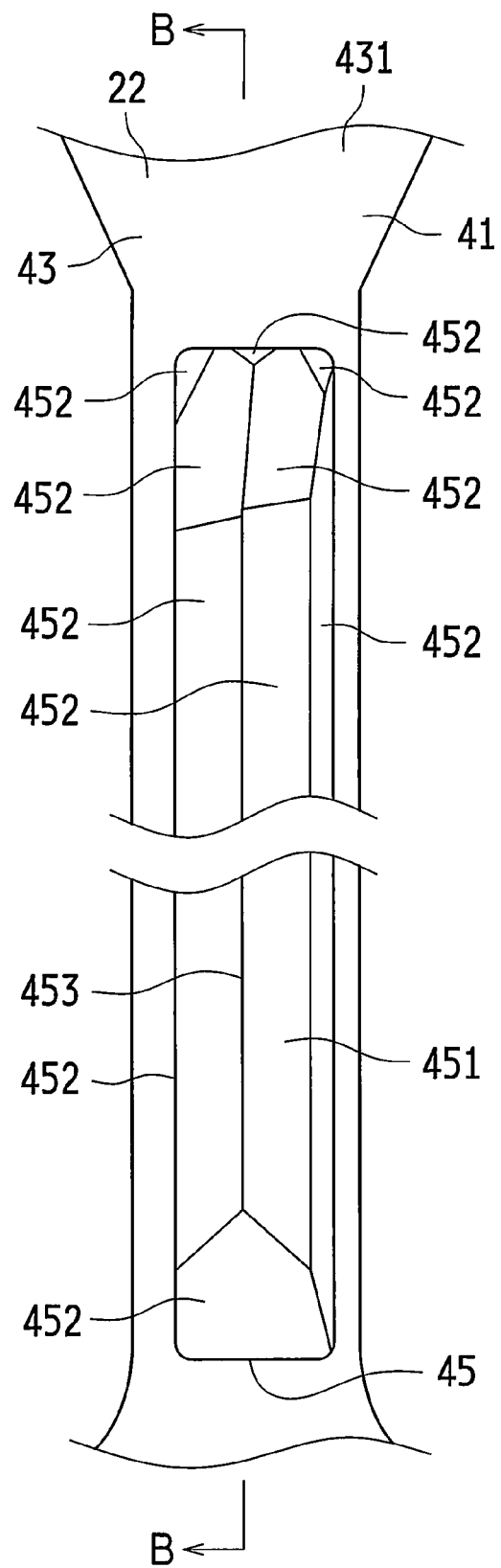
FIG. 4 is a schematic back view of the groove formed in the first leg portion of the tuning-fork type crystal resonator plate according to the first embodiment of the present invention.
Figure 6:
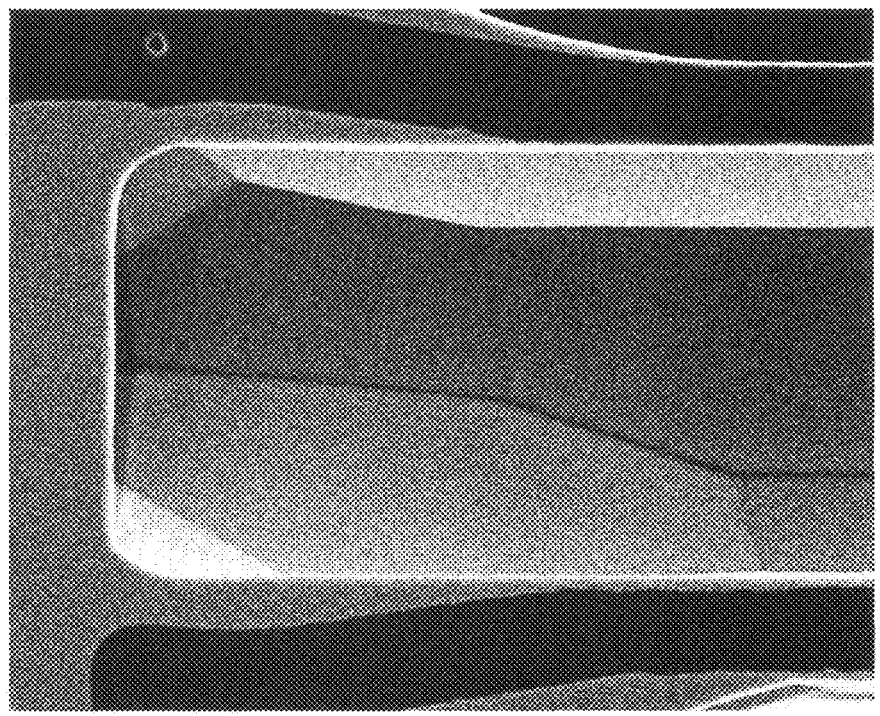
FIG. 6 are diagrams of the groove formed in a first main surface on a side of a base portion corresponding to FIG. 3. The upper diagram of FIG. 6 shows a conventional crystal resonator plate, and the lower diagram of FIG. 6 shows the crystal resonator plate according to the embodiment of the present invention.
Figure 6:
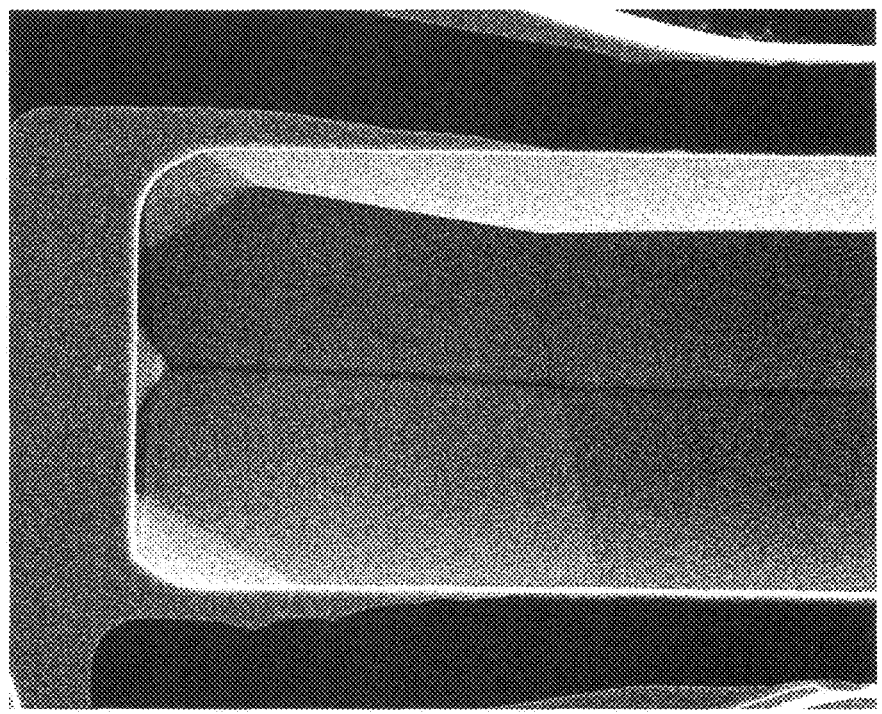
Figure 7:
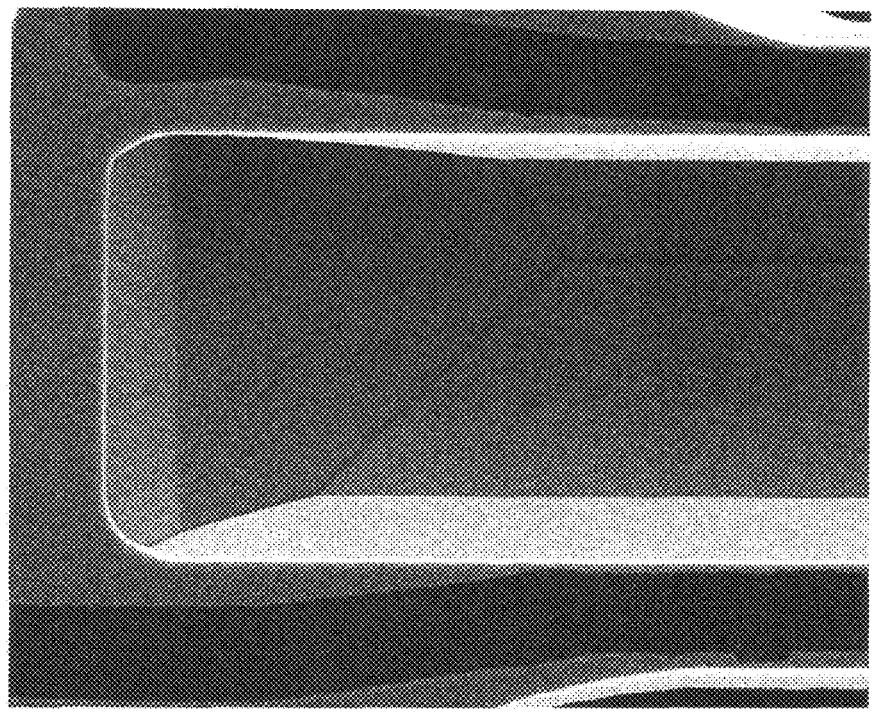
FIG. 7 are diagrams of the groove formed in a second main surface on the side of the base portion corresponding to FIG. 4. The upper diagram of FIG. 7 shows the conventional crystal resonator plate, and the lower diagram of FIG. 7 shows the crystal resonator plate according to the embodiment of the present invention.
Figure 7:
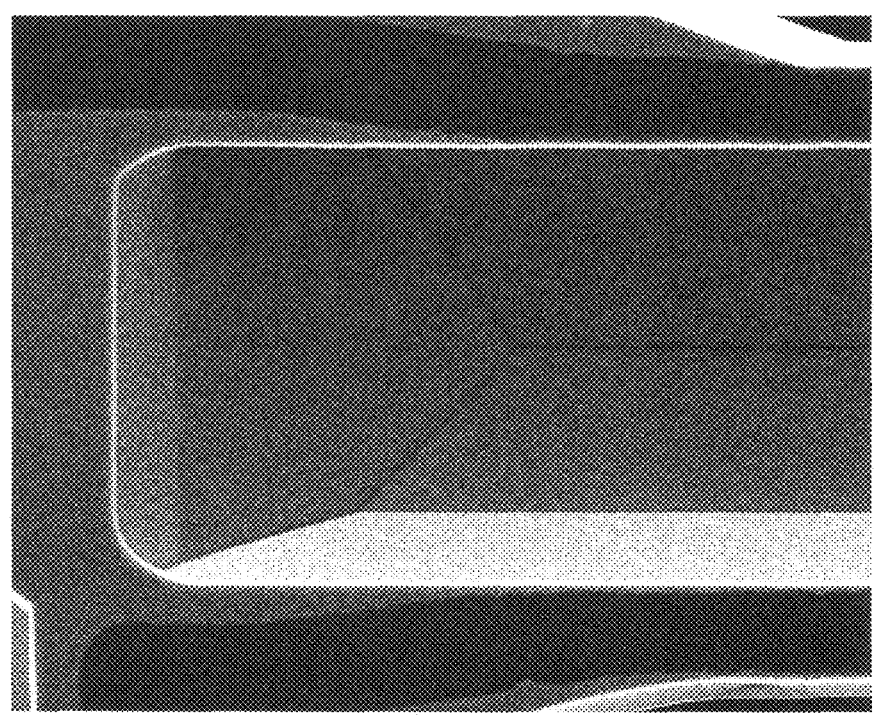
Figure 8:
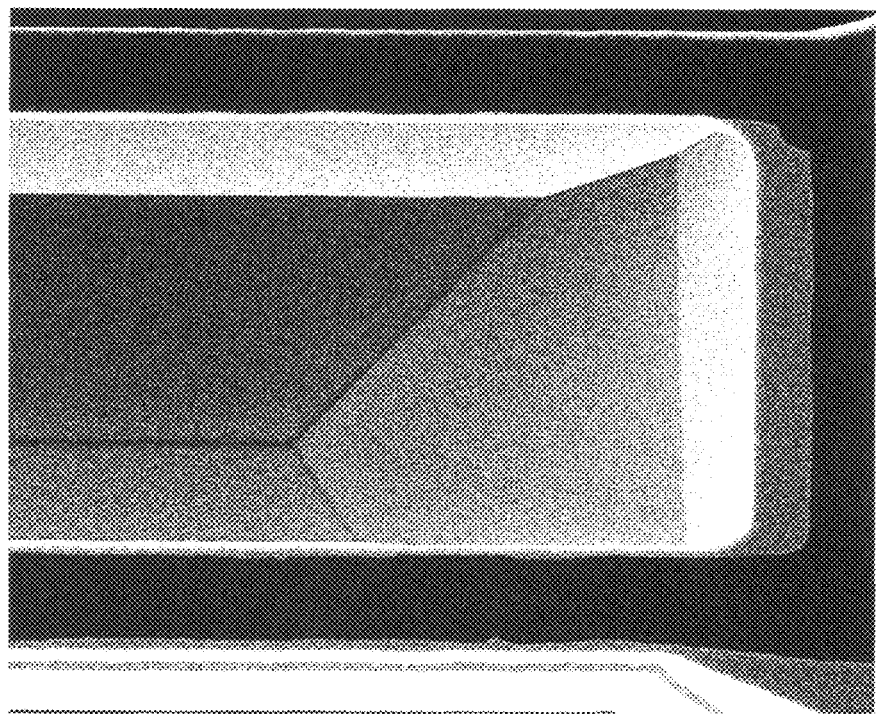
FIG. 8 are diagrams of the groove formed in the first main surface on a side of an adjustment portion corresponding to FIG. 3. The upper diagram of FIG. 8 shows the conventional crystal resonator plate, and the lower diagram of FIG. 8 shows the crystal resonator plate according to the embodiment of the present invention.
Figure 8:
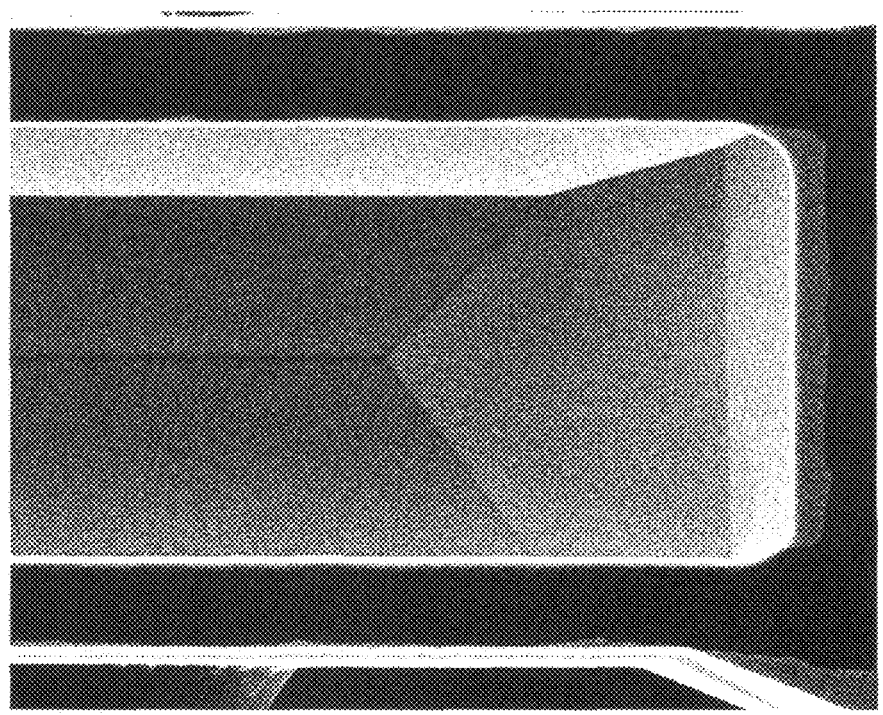
Figure 9:
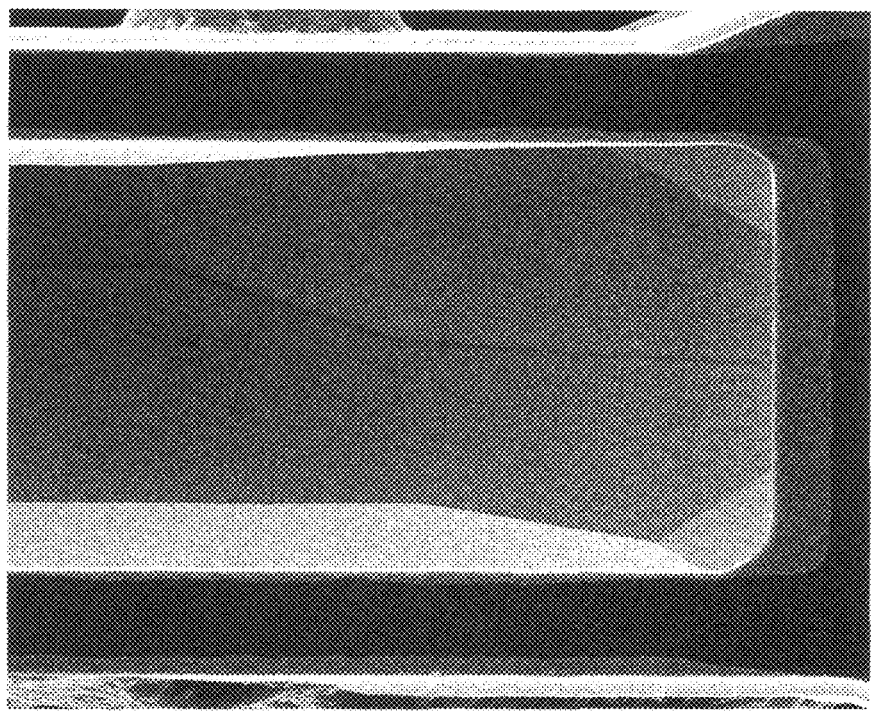
FIG. 9 are diagrams of the groove formed in the second main surface on the side of the adjustment portion corresponding to FIG. 4. The upper diagram of FIG. 9 shows the conventional crystal resonator plate, and the lower diagram of FIG. 9 shows the crystal resonator plate according to the embodiment of the present invention.
Figure 9:
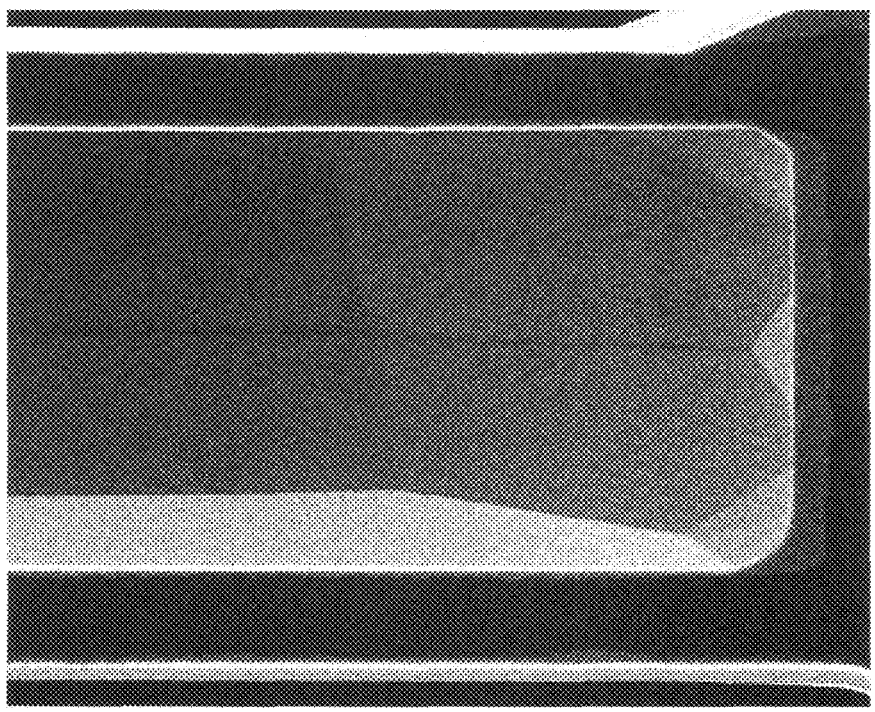
Figure 10:
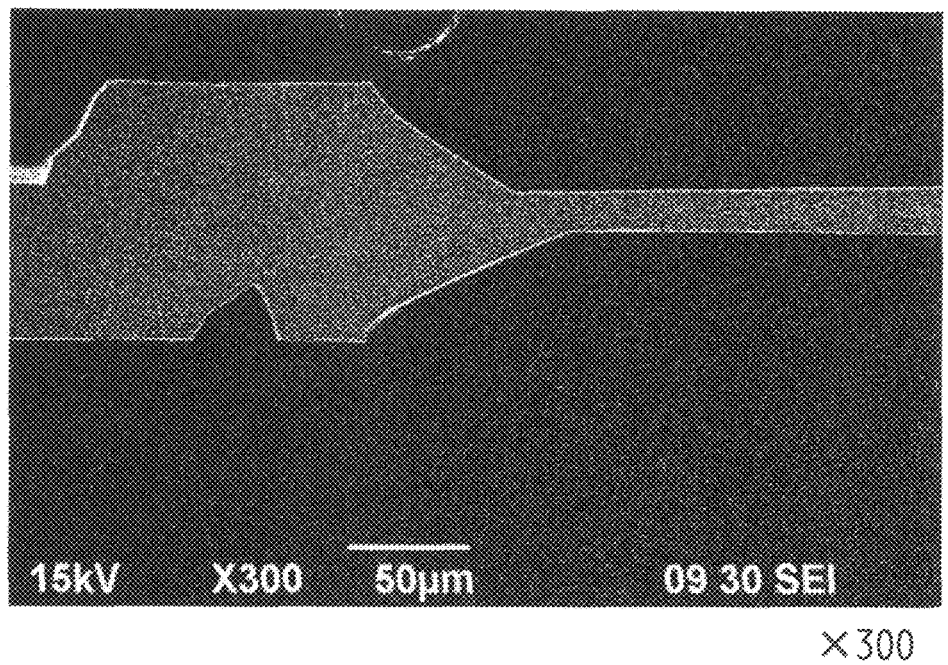
FIG. 10 are diagrams of the groove on the side of the adjustment portion corresponding to FIG. 5. The upper diagram of FIG. 10 shows the conventional crystal resonator plate, and the lower diagram of FIG. 10 shows the crystal resonator plate according to the embodiment of the present invention.
Figure 10:
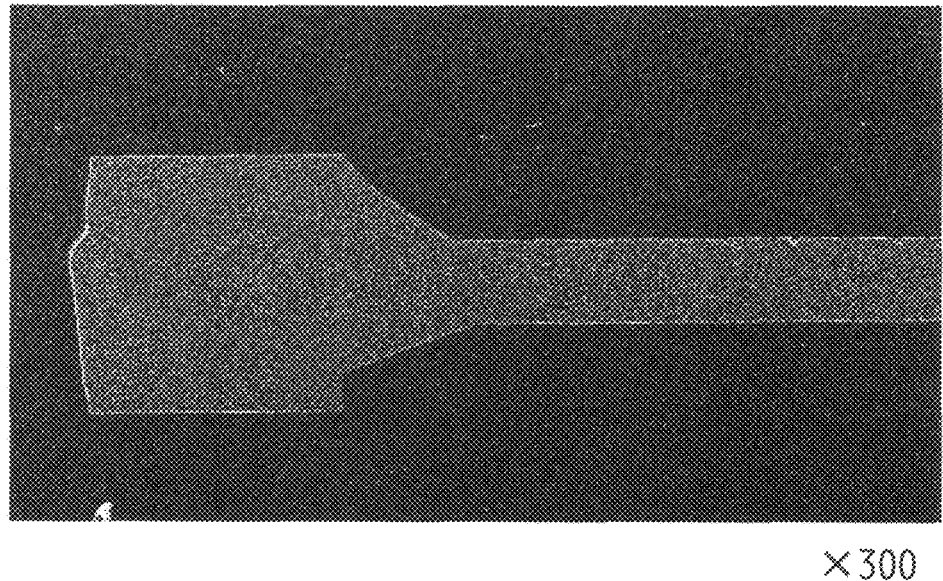
Figure 11:
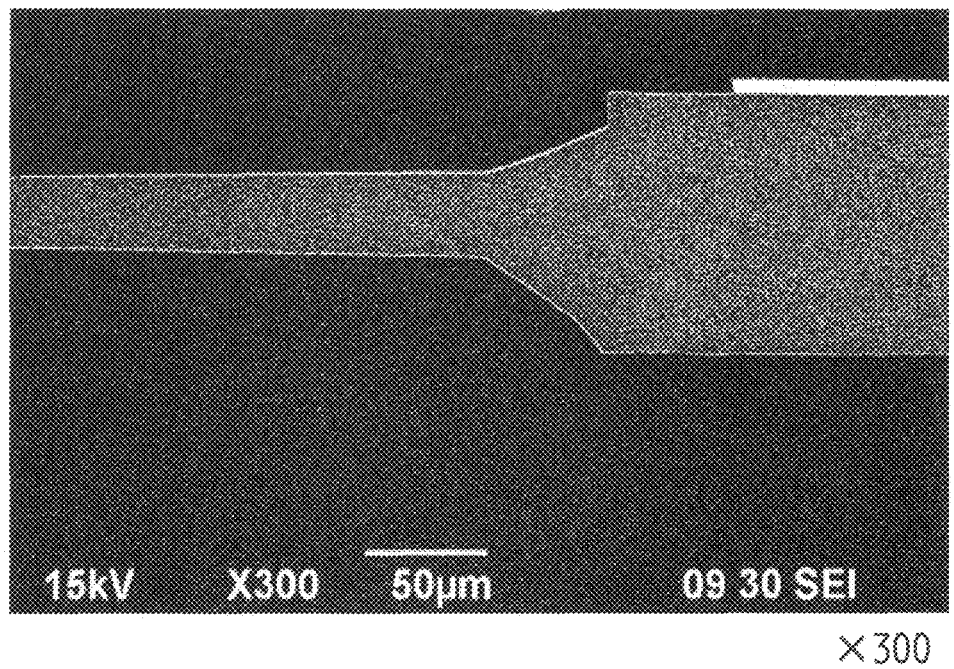
FIG. 11 are diagrams of the groove on the side of the adjustment portion corresponding to FIG. 5. The upper diagram of FIG. 11 shows the conventional crystal resonator plate, and the lower diagram of FIG. 11 shows the crystal resonator plate according to the embodiment of the present invention.
Figure 11:
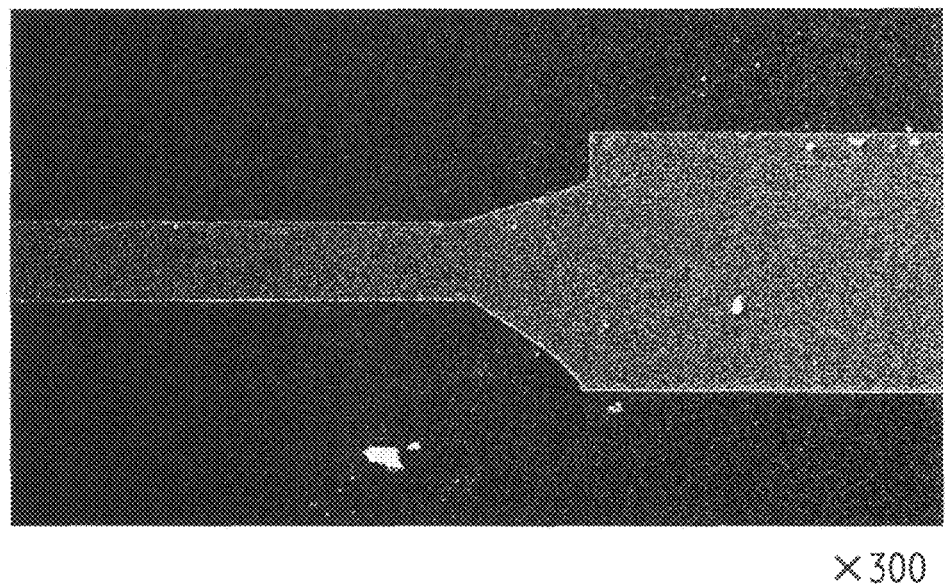

FIG. 6 are diagrams of the groove 45 formed in the first main surface 21 on the side of the base portion 5 corresponding to FIG. 3. The upper diagram of FIG. 6 shows the conventional crystal resonator plate, and the lower diagram of FIG. 6 shows the crystal resonator plate 2 according to the present embodiment. FIG. 7 are diagrams of the groove 45 formed in the second main surface 22 on the side of the base portion 5 corresponding to FIG. 4. The upper diagram of FIG. 7 shows the conventional crystal resonator plate, and the lower diagram of FIG. 7 shows the crystal resonator plate 2 according to the present embodiment. FIG. 8 are diagrams of the groove 45 formed in the first main surface 21 on the side of the adjustment portion 44 corresponding to FIG. 3. The upper diagram of FIG. 8 shows the conventional crystal resonator plate, and the lower diagram of FIG. 8 shows the crystal resonator plate 2 according to the present embodiment. FIG. 9 are diagrams of the groove 45 formed in the second main surface 22 on the side of the adjustment portion 44 corresponding to FIG. 4. The upper diagram of FIG. 9 shows the conventional crystal resonator plate, and the lower diagram of FIG. 9 shows the crystal resonator plate 2 according to the present embodiment. FIG. 10 are diagrams of the groove 45 on the side of the adjustment portion 44 corresponding to FIG. 5. The upper diagram of FIG. 10 shows the conventional crystal resonator plate, and the lower diagram of FIG. 10 shows the crystal resonator plate 2 according to the present embodiment. FIG. 11 are diagrams of the groove 45 on the side of the adjustment portion 44 corresponding to FIG. 5. The upper diagram of FIG. 11 shows the conventional crystal resonator plate, and the lower diagram of FIG. 11 shows the crystal resonator plate 2 according to the present embodiment.

As shown in FIGS. 6 to 11, compared with the conventional crystal resonator plate, in the crystal resonator plate 2 according to the present embodiment, the groove 45 on the side of the first main surface 21 and the groove 45 on the side of the second main surface 22 are formed so as to be biased relative to the center of the leg portion 41/leg portion 42 in the width direction. In such a state, the lowermost point 453 of the groove 45 on the side of the first main surface 21 is positioned in the middle of the groove 45 on the side of the first main surface 21 in the width direction, and the lowermost point 453 of the groove 45 on the side of the second main surface 22 is positioned in the middle of the groove 45 on the side of the second main surface 22 in the width direction. In the crystal resonator plate 2 according to the present embodiment, the length of the lowermost point 453 is increased compared with the conventional crystal resonator plate, and the number of the side surfaces 452 is decreased.

In the crystal resonator plate 2 for which a crystal plate is used according to the present embodiment, in the inner surface 451 of each of the grooves 45 formed on both main surfaces 21 and 22 of each of the first leg portion 41 and the second leg portion 42, not all side surfaces 452 can be formed so as to be perpendicular to the first main surface 21 (or the second main surface 22). However, such a configuration also can be effective to maintain a weight balance of each of the first leg portion 41 and the second leg portion 42 by forming the groove 45 so as to be biased relative to the center of the first leg portion 41/second leg portion 42 in the width direction (X-axis direction).

However, only forming the groove 45 so as to be biased relative to the center of the first leg portion 41/second leg portion 42 in the width direction (X-axis direction) cannot be the optimal means to maintain the weight balance of each of the first leg portion 41 and the second leg portion 42. That is, even if the groove 45 is formed so as to be maximally biased relative to the center of the first leg portion 41/second leg portion 42 in the width direction (X-axis direction), the weight of the first leg portion 41/second leg portion 42 cannot be uniformed to the extent that the weight balance is maintained. This relates specifically to the current tendency of the crystal resonator plate 2 to be miniaturized. The conventional large-size tuning-fork type crystal resonator plate can maintain the balance without consideration of the weight balance. However, in the miniaturized crystal resonator plate 2, the first leg portion 41 and the second leg portion 42 are also miniaturized and narrowed, and the weight balance is lost when the grooves 45 are formed in the miniaturized/narrowed first leg portion 41 and the second leg portion 42. Thus, the problem that was unthinkable with respect to the conventional tuning-fork type crystal resonator plate is accompanied by the miniaturization.

In contrast, the present embodiment has characteristics that the groove 45 is formed so as to be biased relative to the center of the first leg portion 41/second leg portion 42 in the width direction (X-axis direction), and that the lowermost point 453 of the groove 45 is positioned in the middle of the groove 45 of each of the first leg portion 41 and the second leg portion 42 in the width direction (X-axis direction) in the state viewed from the end surface in the width direction (X-axis direction). In the present embodiment, since the lowermost point 453 of the groove 45 is positioned in the middle of the groove 45 in the width direction (X-axis direction), further weight correction can be performed to the configuration using a crystal plate, in which the grooves 45 are formed so as to be biased relative to the respective centers of the first leg portion 41 and the second leg portion 42 in the width direction (X-axis direction), so that the weight balance can be maintained. This relates to the fact that a crystal plate is used for the crystal resonator plate 2. The side surfaces 452 composed of the plurality of the surfaces of the groove 45 include inclined surfaces. The inclined surfaces of the side surfaces 452 (the plurality of surfaces) have different angles of inclination. Therefore, by forming the grooves 45, the leg portions (the first leg portion 41 and the second leg portion 42) lose the weight balance. However, in the present embodiment, the lowermost point 453 of the groove 45 is positioned in the middle of the groove 45 in the state viewed from the end surface of each of the first leg portion 41 and the second leg portion 42 in the width direction (X-axis direction). Thus, it is possible to correct the angles of inclination of the inclined surfaces of the side surfaces 452 of the groove 45, and the weight correction of the leg portions (the first leg portion 41 and the second leg portion 42) can be performed due to the correction of the angles. Consequently, the weight balance can be maintained and the shapes of grooves formed in each of the first leg portion 41 and the second leg portion 42 can prevent the characteristics (e.g., the CI value) from being affected.

Specifically, in the present embodiment using the crystal plate, the grooves 45 are formed in each of the first leg portion 41 and the second leg portion 42 so as to be biased relative to the respective centers of the first leg portion 41 and the second leg portion 42 in the width direction (X-axis direction), and the lowermost point 453 of the groove 45 is positioned in the middle of the groove 45 in the X-axis direction in the state viewed from the end surface in the width direction (X-axis direction) as shown in FIG. 2. Thus, it is possible to prevent the weight balance of the first leg portion 41 and the second leg portion 42 from being lost.

The position of the groove 45 is biased relative to the center of the first leg portion 41/second leg portion 42 in the width direction (X-axis direction), so that the left and right weight balance of the first leg portion 41 and the second leg portion 42 in the width direction (X-axis direction) can be maintained. Furthermore, since the lowermost point 453 of the groove 45 is positioned in the middle of the groove 45 in the X-axis direction in the state viewed from the end surface of each of the first leg portion 41 and the second leg portion 42 in the width direction (X-axis direction), it is possible to reduce the differences in the angles of inclination of the inclined surfaces of the side surfaces 452 (the plurality of surfaces). In the result, a good weight balance is maintained. On the other hand, in the conventional tuning-fork type crystal resonator plate, the angles of inclination of the left and right inclined surfaces in the leg portion considerably differ from each other. Accordingly, the vibrations of the left and right leg portions in the longitudinal direction differ from each other, which deteriorating the weight balance.

Also, in a case in which the groove has a bottom surface differently from the present embodiment, the position of the lowermost point cannot be determined, which deteriorates the weight balance. In the present embodiment, this problem does not occur. In the present embodiment, the groove has no bottom surface, but has only the lowermost point 453.

Furthermore, in the conventional tuning-fork type crystal resonator plate that has the grooves in the respective leg portions, not only the main vibration for the excitation but also other vibration modes (longitudinal vibration mode and the like) are generated. This relates to the fact that, in the conventional configuration, the lowermost point or the bottom surface of the groove is formed so as to be significantly biased relative to the center of the groove in the width direction. Also, the inner surface of the groove is a surface inclined relative to the main surface.

In contrast, in the present embodiment, the grooves 45 are formed in each of the first leg portion 41 and the second leg portion 42 so as to be biased relative to the respective centers of the first leg portion 41 and the second leg portion 42 in the width direction (X-axis direction), and the lowermost point 453 of the groove 45 is positioned in the middle of the groove 45 in the width direction (X-axis direction) in the state viewed from the end surface of each of the first leg portion 41 and the second leg portion 42 in the width direction (X-axis direction). Thus, in the state viewed from the end surface of each of the first leg portion 41 and the second leg portion 42 in the width direction (X-axis direction), the shapes of the side surfaces 452 out of the inner surface of the groove 45 can be substantially symmetrical. Also, compared with the conventional tuning-fork type crystal resonator plate, one or more inclined surfaces out of the inner surface of the groove 45 can be decreased. In the result, it is possible to suppress the generation of the other vibration modes (longitudinal vibration mode and the like) that would be caused by the decreased inclined surfaces. Thus, it is possible to prevent the characteristics of the crystal resonator plate 2 from degrading, specifically, it is possible to decrease the CI value, or to suppress the increase of the CI value.

These days, there is a tendency of miniaturization of the size of the package for the piezoelectric resonator device, such as the crystal resonator 1 and an oscillator (not shown), on which the crystal resonator plate 2 is mounted (e.g., the package size: not more than 2.0 mm×1.2 mm). The inventor has confirmed that, according to the miniaturization, spurious is generated in the vibration of the crystal resonator plate 2. On the other hand, conventionally, the spurious has hardly been generated in the crystal resonator plate 2, and there has been no need to consider spurious suppression. However, in the actual miniaturized crystal resonator plate 2, it is necessary to consider the spurious suppression. With regard to the spurious occurrence, it is possible to suppress the spurious in the present embodiment, by reducing the inclined surfaces of the side surfaces 452 of the groove 45, and reducing the differences in the angles of inclination among the inclined surfaces. Thus, the present embodiment is optimal for the miniaturized crystal resonator plate 2. Furthermore, it is possible to prevent the value of oscillation frequency (the value of the main vibration) from being changed due to the spurious occurrence.

Also, the respective lowermost points 453 of the groove 45 on the side of the first main surface 21 and the groove 45 on the side of the second main surface 22 are opposed to each other in a state viewed from the end surface in the protruding direction. Thus, it is possible to prevent the weight balance from being deteriorated in the thickness direction of each of the first leg portion 41 and the second leg portion 42. In the result, it is possible to suppress the generation of other vibration modes (longitudinal vibration mode and the like) due to deterioration of the weight balance. Thus, it is possible to prevent the characteristics of the crystal resonator plate 2 from degrading, specifically, it is possible to decrease the CI value, or to suppress the increase of the CI value.

Figure 12:
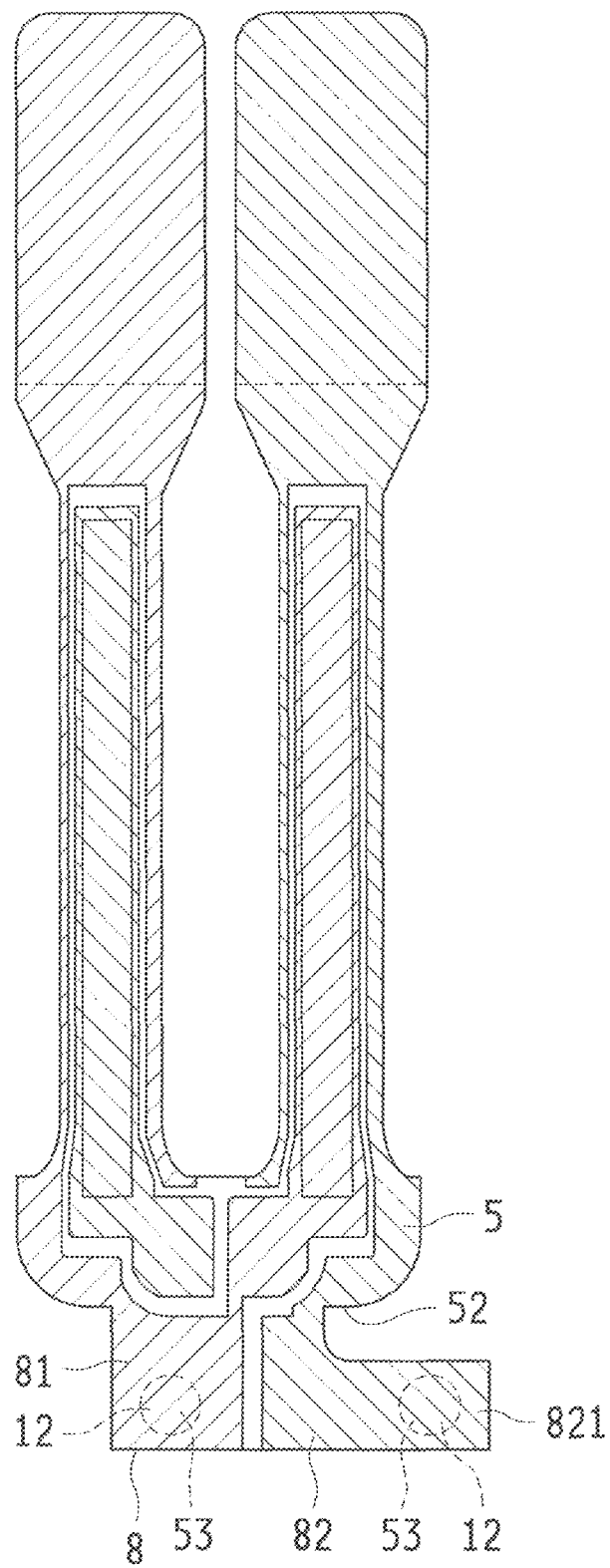
FIG. 12 is a schematic plan view of the tuning-fork type crystal resonator plate according to another embodiment of the present invention.

The crystal resonator plate 2 according to the embodiment described above is bonded to the electrode pads 35 of the base 3 at the two joints 53 of the base portion 5 via the conductive bumps 12. However, the present invention is not limited thereto. As shown in FIG. 12, a bonding portion 8 may be protruded from a second end surface 52 of the base portion 5, thus the crystal resonator plate 2 may be bonded to the electrode pads 35 of the base 3 at the bonding portion 8 via the conductive bumps 12.

The bonding portion 8 as shown in FIG. 12 is shaped so as to protrude outward from the middle portion of the second end surface 52 of the base portion 5 in the width direction. Specifically, as shown in FIG. 12, the bonding portion 8 is made up of: a short-side portion 81 protruding from the second end surface 52 of the base portion 5 in the perpendicular direction in plan view; and a long-side portion 82 continuing and extending from the distal end portion of the short-side portion 81 toward the width direction of the base portion 5. A distal end portion 821 of the long-side portion 82 faces the base portion 5 in the width direction. That is, the bonding portion 8 is formed in a L-shape in plan view perpendicularly bent in plan view. In the bonding portion 8, two joints 53 are provided, which are connected to the electrode pads 35 of the base 3 via the conductive bumps 12.

In the present embodiment, the grooves 45 are formed in the respective main surfaces 21 and 22 of each of the leg portions 41 and 42. However, the present invention is not limited thereto. The groove 45 may be formed only in either one of the main surfaces 21 and 22 of each of the leg portion 41 and 42. In this case also, the effect according to the present embodiment is obtained. However, it is preferable that the groove 45 is formed in each of the main surfaces 21 and 22.

The present invention can be embodied and practiced in other different forms without departing from the spirit and essential characteristics of the present invention. Therefore, the above-described embodiments are considered in all respects as illustrative and not restrictive. The scope of the invention is indicated by the appended claims rather than by the foregoing description. All variations and modifications falling within the equivalency range of the appended claims are intended to be embraced therein.

This application claims priority based on Patent Application No. 2012-280035 filed in Japan on Dec. 21, 2012. The entire contents thereof are hereby incorporated in this application by reference.

INDUSTRIAL APPLICABILITY

The present invention is applicable to a tuning-fork type crystal resonator plate using a crystal.

DESCRIPTION OF REFERENCE NUMERALS

1 Tuning-fork type crystal resonator
11 Inner space
12 Conductive bump
2 Crystal resonator plate
21 First main surface
22 Second main surface
23 Gap portion
3 Base
31 Bottom portion
32 Dike portion
33 Step portion
34 Metallization layer
35 Electrode pad
41 First leg portion
411 Side surface of first leg portion
42 Second leg portion
421 Side surface of second leg portion
43 Excitation portion
431 Distal end portion of excitation portion
44 Adjustment portion
45 Groove
451 Inner surface
452 Side surface
453 Lowermost point
46 First inclined surface
47 Second inclined surface
5 Base portion
51 First end surface
52 Second end surface
53 Joint
61 First excitation electrode
62 Second excitation electrode
63, 64 Lead electrode
7 Metal film for frequency adjustment
8 Bonding portion
81 Short-side portion
82 Long-side portion
821 Distal end portion of long-side portion

The invention claimed is:

1. A tuning-fork type crystal resonator plate for which a crystal plate having a crystal orientation is used, comprising:
a base portion; and
a pair of leg portions protruding from the base portion in one direction,
wherein a groove is formed in each main surface of each of the leg portions so that the groove is biased relative to a center of the corresponding leg portion in a width direction and that distances from the groove to both side surfaces of the corresponding leg portion are different from each other, and
wherein side surfaces of both sides of the groove have different angles of inclination, the inclined side surfaces of both sides of the groove are formed with a lowermost point of the groove being interposed therebetween, and the lowermost point of the groove is positioned in a middle of the corresponding groove in the width direction in a state viewed from an end surface in the width direction.

2. The tuning-fork type crystal resonator plate according to claim 1,
wherein, in both main surfaces of the leg portions, the groove on a side of a first main surface and the groove on a side of a second main surface are respectively formed, and
wherein the lowermost point of the groove on the side of the first main surface and the lowermost point of the groove on the side of the second main surface are opposed to each other in a state viewed from an end surface in the protruding direction.

3. The tuning-fork type crystal resonator plate according to claim 1, wherein each leg further comprises a pair of electrode drivers.

4. The tuning-fork type crystal resonator plate according to claim 1, wherein the lowermost point of each groove on each leg portion is positioned in the middle of the x-axis direction.

* * * * *